HIGH FREQUENCY SIGNAL COMBINING

Filed Jan. 24, 1966

INVENTOR.
THEODORE S. SAAD
BY
Wolf, Greenfield & Hieken
ATTORNEYS

United States Patent Office
3,532,989
Patented Oct. 6, 1970

3,532,989

HIGH FREQUENCY SIGNAL COMBINING

Theodore S. Saad, Westwood, Mass., assignor to Sage Laboratories, Inc., East Natick, Mass., a corporation of Massachusetts Filed Jan. 24, 1966, Ser. No. 522,657
Int. Cl. H04b *1/26*
U.S. Cl. 325—445 3 Claims

ABSTRACT OF THE DISCLOSURE

Two output hybrid mixers each have an input port coupled to a respective output port of an input hybrid having a pair of inputs respectively energized by signal and local oscillator signals to provide a difference frequency signal output on the connected together outputs of the output hybrid mixers.

Figure 1:
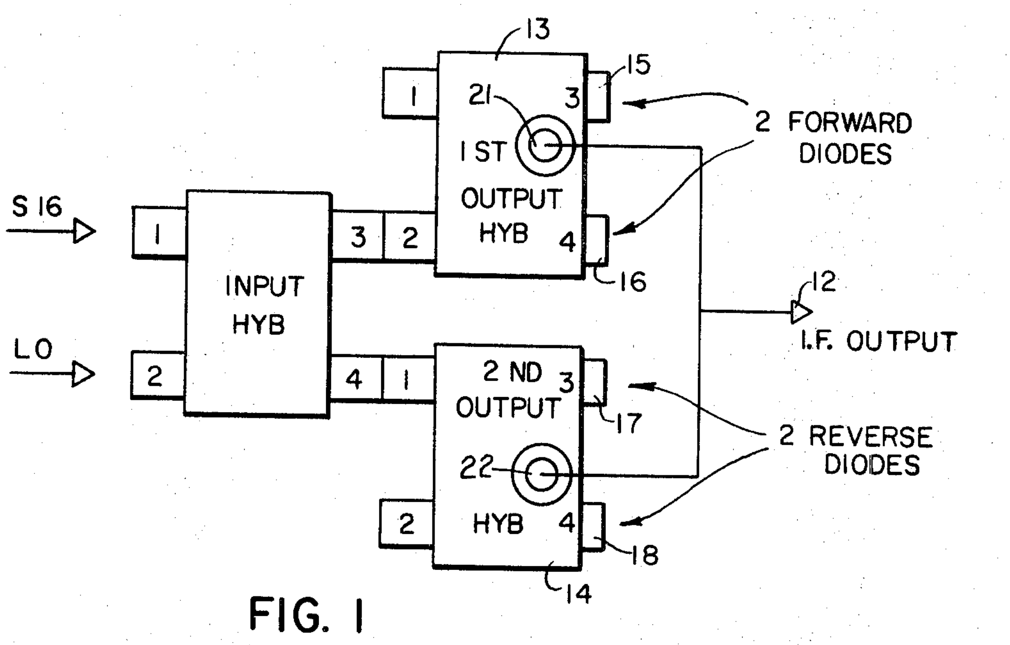

The present invention relates in general to high frequency signal combining and more particularly concerns novel apparatus for combining high frequency signal and local oscillator signals to provide an intermediate frequency signal with exceptionally low noise figure, high isolation between local oscillator and signal inputs, low VSWR, and local oscillator noise cancellation.

It is an important object of this invention to provide a balanced mixer exhibiting exceptionally high performance.

It is another object of the invention to provide a balanced mixer for combining local oscillator and input signals to provide an I-F signal of lower frequency characterized by low noise figure, low VSWR at both local oscillator and signal inputs, and high isolation between local oscillator and signal inputs over relatively wide range of frequencies.

According to the invention, there are an input hybrid means and first and second output hybrid means. Each hybrid means has first, second, third and fourth signal ports. Each hybrid means has the property that when each of the signal ports is terminated in its respective characteristic impedance, each first port is effectively isolated from each second port and each third port is effectively isolated from each fourth port so that energy applied to a first port divides substantially equally between the third and fourth ports with virtually no energy reaching a second port and energy applied to a second port divides substantially equally between the third and fourth ports with virtually no energy reaching the first port. Means are provided for intercoupling the third port of the input hybrid means and the second port of the first output hybrid means. Means are provided for intercoupling the fourth port of the input hybrid means and the first port of the second output hybrid means. The third and fourth ports of the first output hybrid means are terminated in unilaterally conducting devices poled in the same sense, such as a pair of forward mixer diodes. Means are provided for intercoupling like ones of anode and cathode electrodes of the first pair of unilaterally conducting devices. The third and fourth ports of the second output hybrid means are terminated in a second pair of unilaterally conducting devices, such as a pair of reverse mixer diodes, and means are provided for intercoupling like ones of the anode and cathode electrodes of the second pair which latter like electrodes are different from the like electrodes of the first pair that are intercoupled. These intercoupled electrodes of the first and second pairs of unilaterally conducting devices are intercoupled. When a local oscillator and input signal are coupled to respective ones of the input hybrid means first and second ports, an I-F signal of I-F frequency corresponding to the difference between the frequencies of the input signal and local oscillator signal is provided on the intercoupled electrodes of the first and second pairs of unilaterally conducting devices.

Figure 2:
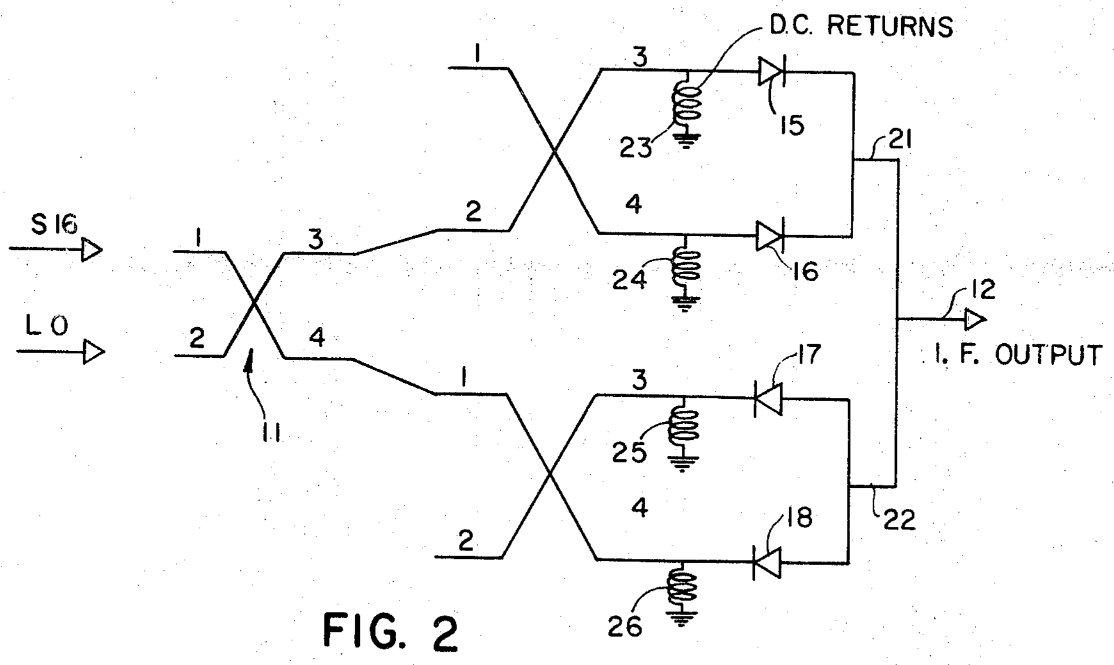

Numerous other features, objects and advantages of the invention will become apparent from the following specification when read in connection with the accompanying drawing in which:

FIG. 1 is a block diagram of a high performance high frequency signal combining system according to the invention; and FIG. 2 is a schematic drawing of the system of FIG. 1.

With reference now to the drawing and more particularly FIG. 1 thereof, there is shown a block diagram illustrating the arrangement of a high performance mixer according to the invention. The apparatus mixes an input signal applied to port 1 and a local oscillator signal applied to port 2 of input hybrid 11 to provide an I-F output signal of frequency corresponding to the difference between the input signal frequency and the local oscillator signal frequency on I-F output terminal 12 while introducing relatively little noise, maintaining a high degree of isolation between the sources of the input signal and the local oscillator signal and providing a good impedance match to these sources by virtue of the low VSWR at ports 1 and 2 of input hybrid 11. The input hybrid 11, the first output hybrid 13 and the second output hybrid 14 each have four signal ports respectively designated 1, 2, 3 and 4. Each of these hybrids has the property that when each of the four ports is terminated in its characteristic impedance, port 1 is effectively electrically isolated from port 2 and port 3 is effectively isolated from port 4 so that energy applied to port 1 divides substantially equally betwen ports 3 and 4 while virtually no energy reaches port 2, and energy applied to port 2 divides substantially equally between ports 3 and 4 with virtually no energy reaching port 1. Typically the respective ports comprise coaxial terminal pairs having an inner signal terminal and an outer grounded, or reference, terminal.

Port 3 of input hybrid 11 is coupled to port 2 of first output hybrid 13. Port 4 of input hybrid 11 is coupled to port 1 of second output hybrid 14. A pair of forward mixer diodes 15 and 16 terminate ports 3 and 4, respectively, of first output hybrid 13. A pair of reverse mixer diodes 17 and 18 terminate ports 3 and 4, respectively, of second output hybrid 14. The cathodes of forward diodes 15 and 16 are internally interconnected in first output hybrid 13 and brought out through I-F terminal 21. The anodes of reverse diodes 17 and 18 are internally interconnected in second output hybrid 14 and brought out through I-F output terminal 22. I-F output terminals 21 and 22 are then interconnected to I-F output terminal 12.

Port 1 of first output hybrid 13 and port 2 of second output hybrid 14 may be left unterminated, terminated in a short circuit or terminated in their respective characteristic impedances. Terminating these ports in their respective characteristic impedances minimizes the VSWR presented at ports 1 and 2 of input hybrid 11. Leaving ports 1 and 2 open circuited or short circuiting these ports improves the noise figure of the system without significantly deteriorating the VSWR at ports 1 and 2 of input hybrid 11 or the isolation therebetween.

Referring to FIG. 2, there is shown a schematic circuit diagram of the system of FIG. 1. The input and two output hybrids are schematically represented as coupled line hybrids of well known type. Identical reference symbols identify corresponding elements in both FIGS. 1 and 2. the D-C returns for the diodes 15, 16, 17 and 18 are represented by the inductors 23, 24, 25 and 26, respectively.

In an actual working embodiment of the invention input hybrid 11 comprised a Sage type No. 751 "Temline"

hybrid and first and second output hybrids 13 and 14 with terminating crystals each comprised Sage type No. 2513 balanced mixers commercially available from Sage Laboratories, Inc. of Natick, Mass.

The circuitry of FIG. 2 could also be embodied in a circuit made in one piece in which the three hybrids are formed by appropriately interconnected transmission lines.

In an exemplary embodiment of the invention using the Sage components described above to provide an I–F signal of 30 megacycles for input signal frequencies of 400 to 1,000 megacycles in which matched loads terminated port 1 of first output hybrid 13 and port 2 of second output hybrid 14, maximum noise figure was 8.7 db, minimum isolation between ports 1 and 2 of input hybrid 11 was 17 db, maximum VSWR at the local oscillator input port 2 of input hybrid 11 was 1.16 and at signal input port 1 was 1.12. Of the order of 1 db improvement in noise figure over the band seemed to be obtained by leaving port 1 of first output hybrid 13 and port 2 of second output hybrid 14 unterminated.

There has been described a novel high frequency signal combining system characterized by exceptional electrical performance in terms of low noise figure, low VSWR and high isolation. It is evident that those skilled in the art may now make numerous modifications and uses of and departures from the specific embodiment described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. High frequency signal combining apparatus comprising, input and first and second output hybrid means each having first, second, third and fourth ports with said first port isolated from said second port and said third port isolated from said fourth port when each port is terminated in its respective characteristic impedance, means for coupling said input hybrid means third port to said first output hybrid means second port, means for coupling said input hybrid means fourth port to said second output hybrid means first port, a first pair of unilaterally conducting devices each having anode and cathode electrodes and coupled to a respective one of said first output hybrid means third and fourth ports and poled in the same sense with like ones of anode and cathode electrodes intercoupled, means for coupling said input hybrid means fourth port to said second output hybrid means first port, a second pair of unilaterally conducting devices each having anode and cathode electrodes and coupled to respective ones of said second output hybrid means third and fourth ports with like ones of anode and ones are different from said like ones of said first cathode electrodes intercoupled which latter like pair, and means intercoupling said like ones of said first pair and said like ones of said second pair.

2. High frequency signal combining apparatus in accordance with claim 1 and further comprising, means for terminating said first output hybrid means first port and said second output hybrid means second port in their respective characteristic impedances.

3. High frequency signal combining apparatus in accordance with claim 1 wherein said first output hybrid means first port and said second output hybrid means second port is open circuited.

References Cited

UNITED STATES PATENTS

| | | | |
|---|---|---|---|
| 3,041,452 | 6/1962 | Robertson et al. | 325—439 |
| 3,159,790 | 12/1964 | Pratt | 325—442 XR |
| 3,241,071 | 3/1966 | Alford | 325—445 XR |

ROBERT L. GRIFFIN, Primary Examiner

R. S. BELL, Assistant Examiner

U.S. Cl. X.R.

325—439, 449